United States Patent
Chen

(12) 
(10) Patent No.: US 10,978,137 B1
(45) Date of Patent: Apr. 13, 2021

(54) MEMORY DEVICE AND METHOD OF OPERATING THE SAME

(71) Applicant: NANYA TECHNOLOGY CORPORATION, New Taipei (TW)

(72) Inventor: Chih-Jen Chen, Kaohsiung (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/795,535

(22) Filed: Feb. 19, 2020

(51) Int. Cl.
*G11C 5/14* (2006.01)
*G11C 11/4074* (2006.01)
*G11C 11/4093* (2006.01)

(52) U.S. Cl.
CPC ...... *G11C 11/4074* (2013.01); *G11C 11/4093* (2013.01)

(58) Field of Classification Search
CPC .................. G11C 11/4074; G11C 11/4093
USPC ......................................................... 365/226
See application file for complete search history.

(56) References Cited

U.S. PATENT DOCUMENTS

| | | | | |
|---|---|---|---|---|
| 6,567,318 B2* | 5/2003 | Bedarida | ................. | G05F 3/245 326/30 |
| 8,054,695 B2* | 11/2011 | Kang | ..................... | G11C 29/46 365/189.09 |
| 8,587,273 B2* | 11/2013 | Chen | .................... | G11C 11/4074 323/273 |
| 8,711,645 B2* | 4/2014 | Chakravarty | .......... | G11C 29/32 365/201 |
| 8,917,560 B1* | 12/2014 | Chen | ........................ | G11C 7/12 365/189.09 |
| 8,958,261 B1* | 2/2015 | Wilson | .................... | G11C 5/145 365/226 |
| 10,049,714 B1* | 8/2018 | Lee | ......................... | G11C 5/145 |
| 10,141,043 B1* | 11/2018 | Lee | ...................... | G11C 11/4074 |
| 10,153,032 B1* | 12/2018 | Hsu | ....................... | G11C 11/406 |
| 2008/0002485 A1* | 1/2008 | Kim | ....................... | G11C 7/1069 365/198 |
| 2015/0123132 A1* | 5/2015 | Yoon | .................... | G11C 29/025 257/48 |
| 2018/0183415 A1* | 6/2018 | Hwang | ................. | H03K 19/20 |

* cited by examiner

*Primary Examiner* — Viet Q Nguyen
(74) *Attorney, Agent, or Firm* — CKC & Partners Co., LLC

(57) ABSTRACT

A memory device includes data receivers, voltage generators, and at least one pass gate. The data receivers include a first data receiver. The voltage generators is coupled to the data receivers and comprises a first voltage generator, in which the first voltage generator is configured to generate a first voltage signal for driving the first data receiver. The at least one pass gate is configured to be turned on under a first operation mode, to pass the first voltage signal generated from the first voltage generator of the voltage generators to at least one data receiver, other than the first data receiver, of the data receivers.

17 Claims, 3 Drawing Sheets

MEMORY DEVICE AND METHOD OF OPERATING THE SAME

BACKGROUND

Technical Field

The present disclosure relates to a memory device and method of operating a memory device. More particularly, the present disclosure relates to a dynamic random access memory (DRAM) device and the method of operating the same.

Description of Related Art

In a memory device, data receiver has to receive the signal generated from the voltage generator to work. In some of the existing memory devices, all of the data receivers in the memory device commonly receive a voltage signal generated from a single one of the voltage generator, in which the voltage signal cannot be adjusted individually. In other existing memory devices, each of the data receivers receive voltage signals generated from different voltage generators respectively, in which the voltage signals can be adjusted individually. However, such an approach also requires higher power consumption.

SUMMARY

One aspect of the present disclosure is related to a memory device which includes data receivers, voltage generators, and at least one pass gate. The data receivers include a first data receiver. The voltage generators is coupled to the data receivers and includes a first voltage generator, in which the first voltage generator is configured to generate a first voltage signal for driving the first data receiver. The at least one pass gate is configured to be turned on under a first operation mode, to pass the first voltage signal generated from the first voltage generator of the voltage generators to at least one data receiver, other than the first data receiver, of the data receivers.

Another aspect of the present disclosure is related to a memory device which includes voltage generators and pass gates. Voltage generators are configured to generate voltage signals for data receivers. Pass gates are coupled to the data receivers and are configured to selectively pass a first voltage signal that is generated by a first voltage generator different from the voltage generators. When at least one first pass gate of the pass gates is turned off, at least one voltage generator of the voltage generators, which corresponds to the at least one first pass gate, is configured to generate at least one voltage signal to at least one data receiver of the data receivers.

Another aspect of the present disclosure is related to a method of operating a memory device. A first voltage signal is generated by a first voltage generator of voltage generators to drive a first data receiver of data receivers. At least one pass gate is turned on under a first operation mode, to pass the first voltage signal generated from the first voltage generator to at least one data receiver, other than the first data receiver, of the data receivers.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
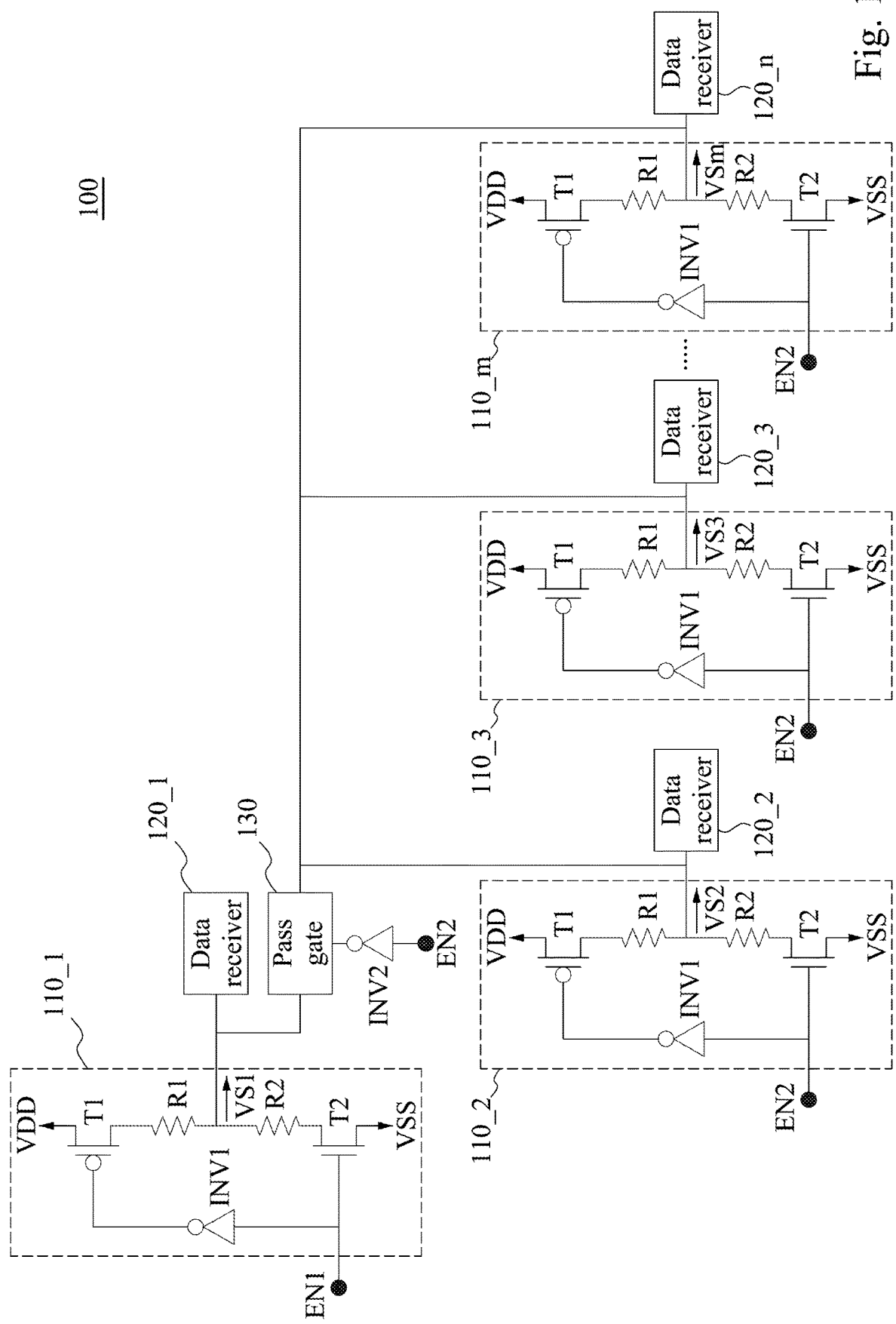
FIG. 1 is a schematic diagram illustrating a memory device, in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

It will be understood that, although the terms first, second, third etc. may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terms herein are used for describing particular embodiments and are not intended to be limited thereto. Single forms such as "a", "this", "the", as used herein also include the plurality form.

In the description herein and throughout the claims that follow, the terms "coupled" or "connected" in this document may be used to indicate that two or more elements physically or electrically contact with each other, directly or indirectly. They may also be used to indicate that two or more elements cooperate or interact with each other.

In the description herein and throughout the claims that follow, the terms "comprise" or "comprising," "include" or "including," "have" or "having," "contain" or "containing" and the like used herein are to be understood to be open-ended, i.e., to mean including but not limited to.

In the description herein and throughout the claims that follow, the phrase "and/or" includes any and all combinations of one or more of the associated listed claims.

In the description herein and throughout the claims that follow, unless otherwise defined, all terms have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram illustrating a memory device 100, in accordance with some embodiments of the present disclosure. As illustrated in FIG. 1, the memory device 100 includes voltage generators 110_1-110_$m$, data receivers 120_1-120_$n$, and a pass gate 130. The voltage generators 110_1-110_$m$ are coupled to the data receivers 120_1-120_$n$, respectively. The pass gate 130 is coupled between the first voltage generator 110_1 and each one of the data receivers 120_2-120_n.

As illustrated in FIG. 1, the data receiver 120_1 is coupled to the voltage generator 110_1, and is configured to directly receive a voltage signal VS1 generated from the voltage generator 110_1. In some embodiments, the data receiver 120_1 continues to receive the voltage signal VS1 generated from the voltage generator 110_1 when memory device 100 operates.

In some embodiments, the pass gate 130 is turned on under a power-down mode, to pass the voltage signal VS1 generated from the voltage generator 110_1 to the data receivers 120_2-120_n. In other words, the pass gate 130 is configured to pass the voltage signal VS1 to the data receivers 120_2-120_n, such that the data receivers 120_2-120_n are still able to receive the voltage signal VS1 from the voltage generator 110_1 under the power-down mode while the voltage generators 110_2-110_m are turned off under the power-down mode, in order to reduce power consumption.

In some embodiments, the pass gate 130 is turned off under a normal mode. When the pass gate 130 is turned off under the normal mode, the data receivers 120_2-120_n receive voltage signals VS2-VSm generated from the voltage generators 110_2-110_m respectively, instead of receiving the voltage signal VS1 generated from the voltage generator 110_1. For example, the data receiver 120_2 receives a voltage signal VS2 generated from the voltage generator 110_2, and the data receiver 120_n receives a voltage signal VSm generated from the voltage generator 110_m, and so on. In this way, each of the data receivers 120_1-120_n can receive each of the voltage signals VS1-VSm generated independently, which makes the memory device 100 operate more flexibly.

In the above embodiments, the number of the voltage generators is the same as the number of the data receivers, which means that m is equal to n. However, various numbers of the voltage generators and the data receivers are within the contemplated scope of the present disclosure. For example, in various embodiments, at least one of the voltage generator 110_1-110_m is coupled to more than one of the data receivers 120_1-120_n. The data receiver 120_2 and the data receiver 120_3 can both be coupled to the same voltage generator 110_2 such that when the pass gate 130 is turned off, both of the data receiver 120_2 and the data receiver 120_3 receive the voltage signal VS2 generated from the voltage generator 110_2. In such embodiments, the number of the voltage generators 110_1-110_m can be different from the number of the data receivers 120_1-120_n, which means that m is not equal to n.

In some embodiments, the voltage generator 110_1 is controlled by an enable signal EN1 to be turned on.

In some embodiments, the pass gate 130 and the voltage generators 110_2-110_m are controlled by an enable signal EN2 to operate oppositely. For example, the voltage generators 110_2-110_m are turned off when the pass gate 130 is turned on. In contrast, the voltage generators 110_1-110_m are turned on when the pass gate 130 is turned off. In some embodiments, the pass gate 130 is controlled through an inverter INV2 by the enable signal EN2 to be turned on or off, while the voltage generators 110_2-110_m are controlled directly by the enable signal EN2 to be turned on or off. In some embodiments, the enable signal EN2 is coupled to the pass gate 130 through the inverter INV2.

In some embodiments, each of the voltage generators 110_1-110m includes a transistor T1, a transistor T2, resistors R1 and R2, and an inverter INV1, as illustrated in FIG. 1. The transistor T1 is coupled to the first voltage source VDD (which also indicates a power voltage in some embodiments). The transistor T2 is coupled to the second voltage source VSS (which also indicates a ground voltage in some embodiments). The resistors R1 and R2 are connected in series and are coupled between the transistor T1 and the transistor T2. The inverter INV1 is coupled between the control terminal of the transistor T1 and the control terminal of the transistor T2. In some embodiments, the transistor T1 is a PMOS (p-type metal-oxide-semiconductor) transistor and the transistor T2 is an NMOS (n-type metal-oxide-semiconductor) transistor. In some embodiments, the voltage generators 110_1-110_m can be different to each other. The components in each of the voltage generators in the present disclosure are not limited to the aforementioned embodiments.

Figure 2:
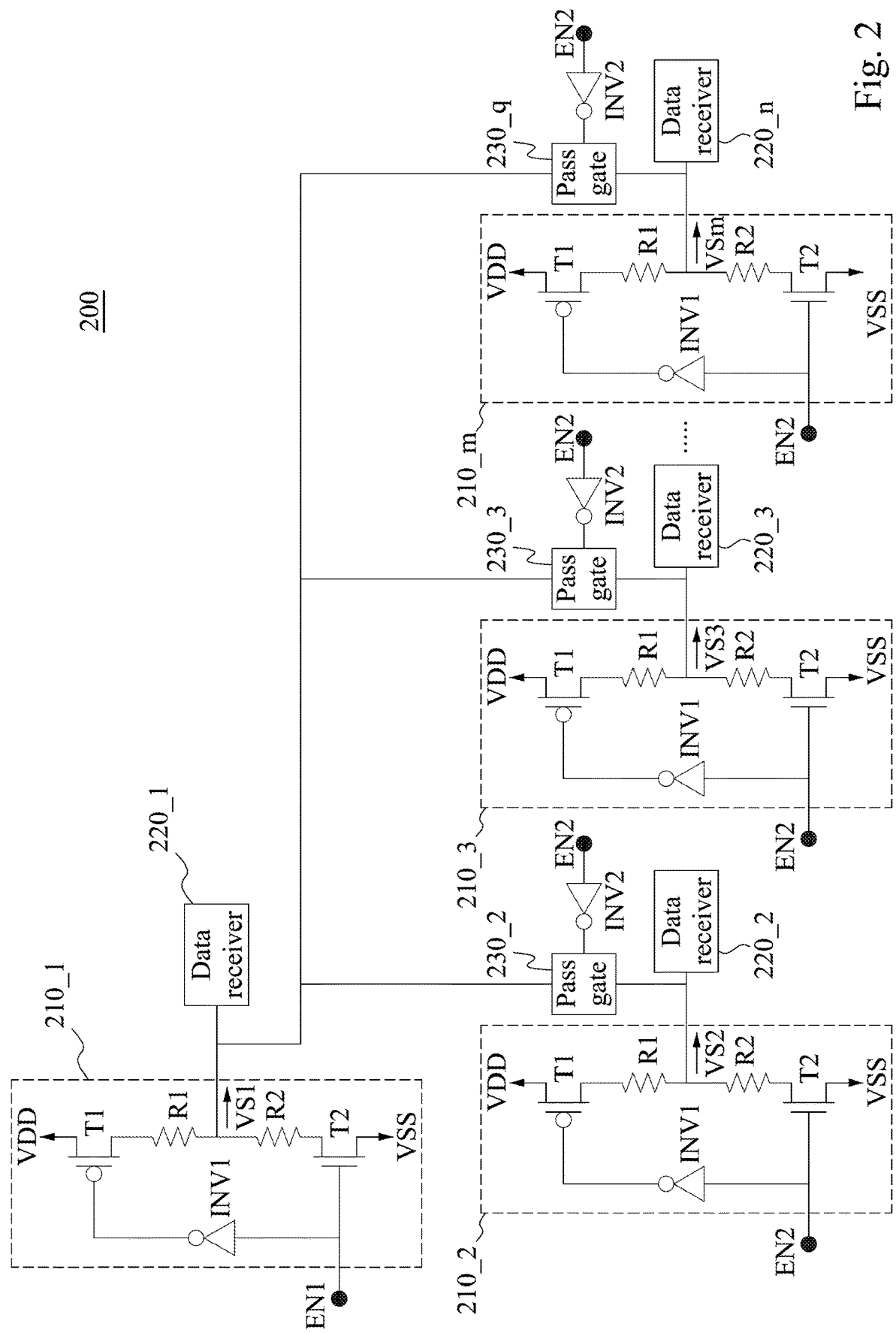
FIG. 2 is a schematic diagram illustrating another memory device, in accordance with some embodiments of the present disclosure.

Reference is now made to FIG. 2. FIG. 2 is a schematic diagram illustrating a memory device 200, in accordance with some embodiments of the present disclosure. The memory device 200 includes voltage generators 210_1-210_m, data receivers 220_1-220_n, and pass gates 230_2-230_q.

Compared to the embodiments of FIG. 1, the memory device 200 includes the pass gates 230_2-230_q configured for the data receivers 220_2-220_n, without the pass gate 130 of FIG. 1. The voltage generators 210_1-210_m are coupled to the data receivers 220_1-220_n respectively. The pass gates 230_2-230_q are coupled between the voltage generator 210_1 and the data receivers 220_2-220_n, and the pass gates 230_2-230_q are configured to pass the voltage signal VS1 generated from the voltage generator 210_1 to the data receivers 220_2-220_n, respectively. In such embodiments, the number of the voltage generators 210_1-210_m and the number of the data receivers 220_1-220_n are the same, which means that m is equal to n. Also, when n is equal to q, the number of the pass gates 230_2-230_q is one less than the number of the data receivers 220_1-220_n.

In some embodiments, each of the data receivers 220_2-220_n is controlled to receive the voltage signal VS1 generated from the voltage generator 210_1 or one of the voltage signal VS2-VSm generated from a corresponding one of the voltage generators 210_2-210_m independently.

In some embodiments, the voltage generator 210_1 is controlled by the enable signal EN1 to be turned on.

In some embodiments, the pass gates 230_2-230_q and the voltage generators 210_2-210_m are controlled by the enable signal EN2 to operate oppositely. The pass gates 230_2-230_q are turned on and the voltage generators 210_2-210_m are turned off, and thus the data receivers 220_1-220_n receive the voltage signal VS1 generated from the voltage generator 210_1. In some embodiments, the pass gates 230_2-230_q are turned off and the voltage generators 210_2-210_m are turned on, and thus the data receivers 220_1-220_n receive the voltage signals VS1-VSm generated from the voltage generators 210_1-210_m respectively.

In some embodiments, some of the pass gates 230_2-230_q are turned on and some of the pass gates 230_2-230_q are turned off. For example, when the pass gate 230_2 is turned on and the pass gate 230_3 is turned off, the voltage generator 210_2 is turned off and the voltage generator 210_3 is turned on. In this way, the data receiver 220_2 receives the voltage signal VS1 generated from the voltage generator 210_1 and the data receiver 220_3 receives the voltage signal VS3 generated from the voltage generator 210_3. By selectively turning on or off the voltage generators 210_2-210_m and the pass gates 230_2-230_q, the memory device 200 can be adapted to different operation modes (e.g., power-down mode, gaming mode, etc.). It should be understood that the present disclosure is not limited to the aforementioned examples.

In some embodiments, the voltage generator 210_1 is controlled by the enable signal EN1, and the pass gates 230_2-230_q and the voltage generators 210_2-210_m are controlled by the enable signal EN2. The memory device 200 can be operated in different modes by setting the enable signal EN1 and the enable signal EN2 to different combinations of logic values. For example, when the enable signal EN1 has logic value 1 and the enable signal EN2 has logic value 0, the pass gate 230_2-230_q are turned on and the voltage generators 210_2-210_m are turned off. When both of the enable signal EN1 and the enable signal EN2 have logic value 1, the pass gate 230_2-230_q are turned off and the voltage generators 210_2-210_m are turned on. The detail operations corresponding to the pass gates 230_2-230_q being turned on or off have been described in the embodiments mentioned above, which will not be repeated herein.

In some embodiments, at least two of the pass gates 230_2-230_q are coupled to different enable signals. For example, the pass gate 230_2 can be controlled by the enable signal EN2 with logic value 0 and the pass gate 230_3 can be controlled by an additional enable signal (not shown) with logic value 1, such that the pass gate 230_2 is turned on and the pass gate 230_3 is turned off. By receiving different enable signals, the pass gates 230_2-230_q can be controlled to be turned on or off independently. The present disclosure is not limited thereto.

In some embodiments, at least one of the pass gates 230_2-230_q is configured to pass the voltage signal VS1 generated from the voltage generator 210_1 to more than one of the data receivers 220_2-220_n. For example, a terminal of the pass gate 230_2 can be coupled to the voltage generator 210_1 and another terminal of the pass gate 230_2 can be coupled to the data receiver 220_2 and the data receiver 220_3. When the pass gate 230_2 is turned on, the data receiver 220_2 and the data receiver 220_3 receive the voltage signal VS1 generated from the voltage generator 210_1, and when the pass gate 230_2 is turned off, the data receiver 220_2 receive the voltage signal VS2 generated from the voltage generator 210_2 and the data receiver 220_3 receive the voltage signal VS3 generated from the voltage generator 210_3. In such embodiments, the number of the pass gates 230_2-230_q is different from the number of the data receivers 220_2-220_n, which means that q is not equal to n.

In some embodiments, at least one of the voltage generators 210_2-210_m is configured to generate a corresponding one of the voltage signals VS2-VSm to drive more than one of the data receivers 220_2-220_n. For example, the voltage generator 210_2 can be coupled to the data receiver 220_2 and the data receiver 220_3, and the pass gate 230_2 is coupled between the voltage generator 210_1 and the data receivers 220_2 and 220_3. When the pass gate 230_2 is turned on, the data receiver 220_2 and the data receiver 220_3 will receive the voltage signal VS1 generated from the voltage generator 210_1, and when the pass gate 230_2 is turned off, both of the data receiver 220_2 and the data receiver 220_3 will receive the voltage signal VS2 generated from the voltage generator 210_2. In such embodiments, the number of the voltage generators 210_2-210_m is different from the number of the data receivers 220_2-220_n, which means that m is not equal to n. It should be understood that each of the pass gates 230_2-230_q can be corresponding to more than one voltage generator, in which the operations are similar to the embodiments mentioned above, which will not be repeated herein.

Figure 3:
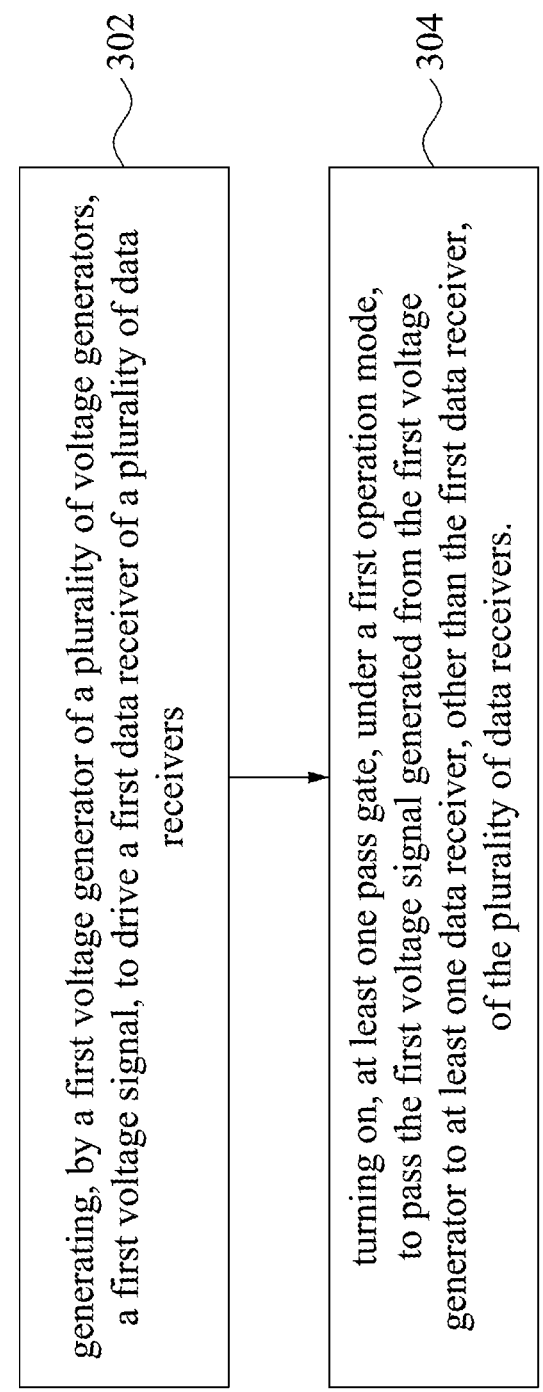
FIG. 3 is a flowchart illustrating the operating method of a memory device, in accordance with some embodiments of the present disclosure.

Reference is now made to FIG. 3. FIG. 3 is a flowchart illustrating a method 300 of operating the memory device as illustrated in FIG. 1 or FIG. 2, in accordance with some embodiments of the present disclosure.

In operation 302, a first voltage signal is generated by a first voltage generator of a plurality of voltage generators, to drive a first data receiver of a plurality of data receivers. For example, with reference to FIG. 1, the voltage signal VS1 is generated by the voltage generator 110_1, to drive the data receiver 120_1.

In operation 304, at least one pass gate is turned on under a first operation mode, to pass the first voltage signal generated from the first voltage generator to at least one data receiver, other than the first data receiver, of the plurality of data receivers. For example, with reference to FIG. 1, the pass gate 130 is turned on under a power-down mode, to pass the voltage signal VS1 generated from the voltage generator 110_1 to the data receivers 120_2-120_n.

In some embodiments, the method 300 further includes receiving a plurality of voltage signals generated from the plurality of voltage generators, respectively by the plurality of data receivers, when the at least one pass gate is turned off under a second operation mode. For example, with reference to FIG. 1, the data receivers 120_2-120_n receive voltage signals VS2-VSm generated from the voltage generators 110_2-110_m respectively, when the pass gate 130 is turned off under the normal mode.

In some embodiments, the method 300 further includes turning on the plurality of voltage generators by at least one enable signal, when the at least one pass gate is turned off. For example, with reference to FIG. 1, the voltage generators 110_2-110_m are turned on when the pass gate 130 is turned off.

In some embodiments, the method 300 further includes controlling the plurality of pass gates by the plurality of enable signals, in which at least two of the plurality of enable signals are the same or different from each other. For example, with reference to FIG. 2, the pass gates 230_2-230_q can all be controlled by the same enable signal EN2. For another example, the pass gate 230_2 can be controlled by the enable signal EN2 and the pass gate 230_3 can be controlled by an additional enable signal (not shown).

In some embodiments, the method 300 further includes turning on a first pass gate of the plurality of pass gates to pass the first voltage signal to a second data receiver of the plurality of data receivers and receiving a second voltage signal from a second voltage generator by a third data receiver of the plurality of data receivers when turning off a second pass gate of the plurality of pass gates. For example, with reference to FIG. 2, when the pass gate 230_2 is turned on and the pass gate 230_3 is turned off, the voltage generator 210_2 is turned off and the voltage generator 210_3 is turned on. The data receiver 220_2 receives the voltage signal VS1 generated from the voltage generator 210_1 and the data receiver 220_3 receives the voltage signal VS3 generated from the voltage generator 220_3.

It should be understood that the operations in FIG. 3 and the embodiments mentioned above are not necessarily performed in the order shown. Alternatively stated, operations may be added, replaced, changed order, and/or eliminated as appropriate, in accordance with the spirit and scope of various embodiments of the present disclosure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:
   a plurality of data receivers comprising a first data receiver;
   a plurality of voltage generators coupled to the plurality of data receivers, configured to generate a plurality of voltage signals respectively, wherein the plurality of voltage generators comprise a first voltage generator, and the first voltage generator is configured to generate a first voltage signal for driving the first data receiver; and
   at least one pass gate configured to be turned on under a first operation mode, to pass the first voltage signal generated from the first voltage generator of the plurality of voltage generators to other data receivers different from the first data receiver of the plurality of data receivers, and configured to be turned off under a second operation mode, so that the plurality of data receivers receive the plurality of voltage signals, respectively.

2. The memory device of claim 1, wherein the plurality of voltage generators are configured to be turned on by at least one enable signal when the at least one pass gate is turned off.

3. The memory device of claim 1, wherein the at least one pass gate comprises:
   a plurality of pass gates configured to pass the first voltage signal generated from the first voltage generator to the other data receivers of the plurality of data receivers, respectively.

4. The memory device of claim 3, wherein a first pass gate of the plurality of pass gates is configured to be turned on to pass the first voltage signal to a second data receiver of the plurality of data receivers, while a third data receiver of the plurality of data receivers is configured to receive a second voltage signal generated from a second voltage generator when a second pass gate of the plurality of pass gates is configured to be turned off.

5. The memory device of claim 3, wherein the plurality of pass gates are configured to be controlled by a plurality of enable signals, and at least two of the plurality of enable signals are the same or different from each other.

6. The memory device of claim 5, wherein the plurality of voltage generators are configured to be turned on by at least one of the plurality of enable signals when the plurality of pass gates are turned off.

7. A memory device, comprising:
   a plurality of voltage generators configured to generate a plurality of voltage signals to a plurality of data receivers; and
   a plurality of pass gates coupled to the plurality of data receivers and configured to selectively pass a first voltage signal that is generated by a first voltage generator different from the plurality of voltage generators,
   wherein when at least one first pass gate of the plurality of pass gates is turned off, the plurality of data receivers are configured to receive the plurality of voltage signals, respectively.

8. The memory device of claim 7, wherein at least one of the plurality of voltage generators comprises:
   an PMOS transistor coupled to a first voltage source;
   an NMOS transistor coupled to a second voltage source;
   two resistors connected in series, coupled between the PMOS transistor and the NMOS transistor; and
   a first inverter coupled between a control terminal of the PMOS transistor and a control terminal of the NMOS transistor.

9. The memory device of claim 8, wherein the plurality of pass gates is coupled to a plurality of enable signals through a second inverter.

10. The memory device of claim 7, wherein the at least one first pass gate of the plurality of pass gates and at least one voltage generator of the plurality of voltage generators corresponding to the at least one first pass gate are coupled to at least one enable signal, and the first voltage generator is coupled to a first enable signal different from the at least one enable signal.

11. The memory device of claim 10, wherein a logic value of the at least one enable signal is different from a logic value of the first enable signal, when the at least one first pass gate is turned off.

12. The memory device of claim 11, wherein the at least one enable signal has logic value 0 and the first enable signal has logic value 1, when the at least one first pass gate is turned off.

13. The memory device of claim 10, wherein a logic value of the at least one enable signal is same as a logic value of the first enable signal, when the at least one first pass gate is turned on.

14. A method of operating a memory device, comprising:
   generating a first voltage signal of a plurality of voltage signals, by a first voltage generator of a plurality of voltage generators, to drive a first data receiver of a plurality of data receivers;
   turning on, at least one pass gate, under a first operation mode, to pass the first voltage signal generated from the first voltage generator to other data receivers different from the first data receiver of the plurality of data receivers; and
   turning off, the at least one pass gate, under a second operation mode, so that the plurality of data receivers receive the plurality of voltage signals, respectively.

15. The method of claim 14, further comprising:
   controlling, by the plurality of enable signals, a plurality of pass gates of the at least one pass gate, wherein at least two of the plurality of enable signals are the same or different from each other.

16. The method of claim 14, further comprising:
   turning on, by at least one enable signal, the plurality of voltage generators, when the at least one pass gate is turned off.

17. The method of claim 14, further comprising:
   turning on, a first pass gate of the at least one pass gate, to pass the first voltage signal to a second data receiver of the plurality of data receivers; and
   receiving, by a third data receiver of the plurality of data receivers, a second voltage signal from a second voltage generator when turning off a second pass gate of the at least one pass gate.

* * * * *

UNITED STATES PATENT AND TRADEMARK OFFICE
CERTIFICATE OF CORRECTION

PATENT NO. : 10,978,137 B1  
APPLICATION NO. : 16/795535  
DATED : April 13, 2021  
INVENTOR(S) : Chih-Jen Chen Page 1 of 1

It is certified that error appears in the above-identified patent and that said Letters Patent is hereby corrected as shown below:

On the Title Page

The name of the Assignee should read as:
"NANYA TECHNOLOGY CORPORATION," rather than "NANY A TECHNOLOGY CORPORATION".

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*